United States Patent
Klunder et al.

(10) Patent No.: US 7,453,645 B2
(45) Date of Patent: Nov. 18, 2008

(54) SPECTRAL PURITY FILTER, LITHOGRAPHIC APPARATUS INCLUDING SUCH A SPECTRAL PURITY FILTER, DEVICE MANUFACTURING METHOD, AND DEVICE MANUFACTURED THEREBY

(75) Inventors: Derk Jan Wilfred Klunder, Geldrop (NL); Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 204 days.

(21) Appl. No.: 11/025,601

(22) Filed: Dec. 30, 2004

(65) Prior Publication Data

US 2006/0146413 A1 Jul. 6, 2006

(51) Int. Cl.
*G02B 27/14* (2006.01)
*G02B 3/00* (2006.01)
*G02B 27/10* (2006.01)

(52) U.S. Cl. .................. 359/634; 359/619; 359/649
(58) Field of Classification Search ........... 359/618, 359/619, 627, 629, 634, 649
See application file for complete search history.

(56) References Cited

U.S. PATENT DOCUMENTS

| 3,464,407 | A | * | 9/1969 | Rinaldi et al. | 606/204.25 |
| 5,103,100 | A | * | 4/1992 | Iketaki | 250/370.01 |
| 6,456,362 | B1 | | 9/2002 | Banine | |
| 6,809,327 | B2 | | 10/2004 | Bristol | |
| 6,987,599 | B2 | * | 1/2006 | Sandstrom | 359/290 |
| 7,221,514 | B2 | * | 5/2007 | Venema | 359/619 |
| 2004/0036977 | A1 | * | 2/2004 | Tanaka et al. | 359/619 |
| 2004/0169838 | A1 | * | 9/2004 | Lee | 355/71 |

* cited by examiner

*Primary Examiner*—Mohammed Hasan
(74) *Attorney, Agent, or Firm*—Pillsbury Winthrop Shaw Pittman, LLP

(57) ABSTRACT

A spectral purity filter includes an aperture, the aperture having a diameter, wherein the spectral purity filter is configured to enhance the spectral purity of a radiation beam by reflecting radiation of a first wavelength and allowing at least a portion of radiation of a second wavelength to transmit through the aperture, the first wavelength being larger than the second wavelength. The spectral purity filter may be used to improve the spectral purity of an Extreme Ultra-Violet (EUV) radiation beam.

26 Claims, 8 Drawing Sheets

SPECTRAL PURITY FILTER, LITHOGRAPHIC APPARATUS INCLUDING SUCH A SPECTRAL PURITY FILTER, DEVICE MANUFACTURING METHOD, AND DEVICE MANUFACTURED THEREBY

BACKGROUND OF THE INVENTION

1. Field of the Invention

The present invention relates to spectral purity filters, lithographic apparatus including such spectral purity filters, a device manufacturing method and a device manufactured thereby.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In addition to Extreme Ultra-Violet (EUV) radiation, an EUV source emits many different wavelengths of light and debris. This non-EUV radiation may be harmful for the EUV lithography system, so it has to be removed by a spectral purity filter. Present spectral purity filters are based on blazed gratings. These gratings may be difficult to produce, since the surface quality of the triangular shaped pattern has to be very high. The roughness of the surface should be lower than 1 nm RMS. Debris mitigation schemes are also applied for suppressing the debris. However, debris mitigation may be problematic as debris mitigation methods which include foil traps and gas buffers may not guarantee effective debris protection. Moreover, use of usual (e.g. Zr) thin filters transmissive for EUV is difficult due to the fragility of the filters and low heat-load threshold. In addition the glue used for filters on mesh is not desirable for H-vacuum systems.

A further problem with existing spectral purity filters is that they change the direction of the light from the EUV source. Therefore, if a spectral purity filter is removed from an EUV lithography apparatus, a replacement spectral purity filter has to be added or a mirror at a proper angle has to introduced. The added mirror introduces unwanted losses into the system.

U.S. Pat. No. 6,456,362, incorporated herein by reference, discloses waveguides for use in EUV lithographic projection apparatus which describes an integrator based on waveguides.

U.S. Pat. No. 6,809,327, incorporated herein by reference, discloses an apparatus including a plasma source to generate a spectrum of radiation that includes EUV radiation, a reflector to generate a beam of EUV radiation from the spectrum of radiation, and a thin film to pass at least a portion of the EUV radiation.

SUMMARY OF THE INVENTION

It is an aspect of the present invention to provide an EUV spectral purity filter which improves the spectral purity of a radiation beam.

According to an embodiment of the present invention, a lithographic spectral purity filter includes an aperture, the aperture having a diameter, wherein the spectral purity filter is configured to enhance the spectral purity of a radiation beam by reflecting radiation of a first wavelength and allowing at least a portion of radiation of a second wavelength to transmit through the aperture, the first wavelength being larger than the second wavelength.

The present invention relates to two main types of spectral purity filters. In the first type of spectral purity filters, the aperture (e.g. pinhole/slit) may reflect radiation having wavelengths that should be suppressed, while transmitting radiation with sufficiently low wavelengths such as EUV. The diameter of the aperture may be below the diffraction limit for the wavelength range that should be suppressed, while being sufficiently above the diffraction limit of radiation such as EUV that should be transmitted. In this second case, suppression is controlled by the diameter of the aperture. In the second type of spectral purity filters, waveguiding is used for suppressing unwanted ranges of wavelengths. In this case, the diameter of the aperture may be above the diffraction limit and the suppression may be controlled by both the diameter and the depth of the aperture.

The spectral purity filter may be configured to reflect light with wavelengths larger than about twice the diameter of the aperture, allowing at least a portion of smaller wavelength radiation to be transmitted through the at least one aperture.

The present invention may therefore use a sub-wavelength aperture as a spectral purity filter. The spectral purity filter reflects light with wavelengths larger than twice the diameter of the aperture.

There may be only a single aperture.

Alternatively, there may be at least two or more apertures or a plurality of apertures forming a patterned array. The apertures may form a regular pattern with a high degree of symmetry or an irregular pattern on the spectral purity filter. The apertures may extend from one side of the spectral purity filter to another.

The shape of the apertures may be adapted for different wavelengths of light. For example, the apertures may be in the form of elongated slits or may be substantially circular (e.g. pinholes). Typically, there may be a plurality of slits or a plurality of substantially circular apertures (e.g. pinholes).

In embodiments where there may be only a single aperture, the aperture may have a diameter of about 0.1-10 µm, for example about 1-2 µm. Furthermore, the spectral purity filter may have a thickness of about 1-20 µm, for example about 10 µm. In these embodiments there is substantially no waveguiding.

In embodiments where there may be a plurality of apertures, the diameter of the apertures may range from about 10-500 nm, about 50-200 nm, or about 100 nm. In these embodiments, the spectral purity filter may have a thickness of about 1-50 µm, for example about 10 µm.

In embodiments where there may be a plurality of apertures, the transparency of the spectral purity filter to different wavelengths may be determined by an aspect ratio between an area formed by the apertures (e.g. the part of the spectral purity filter with holes) and the remaining surface area of the spectral purity filter. The surface area may include about 20-60%, for example about 50%, apertures.

The spectral purity filter may be configured to transmit at least 50%, for example at least about 90%, EUV radiation. The spectral purity filter may act as an effective filter for DUV, UV, IR and visible radiation. The amount of DUV, UV, IR and visible radiation transmitting therethrough may be less than about 5%, less than about 1%, or less than about 0.5%.

The spectral purity filter may be an inline optical element and therefore not change the direction of light from an EUV source. The spectral purity filter may therefore be removed from a lithographic apparatus without the need of replacing it by, for example, a mirror.

The at least one aperture in the spectral purity filter may be formed using micro-machining techniques.

According to a further embodiment, a lithographic spectral purity filter is combined with a waveguide, for example a EUV waveguide. The spectral purity filter with the waveguide may have a high transmission for EUV while the transmission for larger wavelengths may be lower. Once again, this spectral purity filter may be an inline optical element allowing the spectral purity filter to be removed from the lithographic apparatus without the need for replacement by, for example, a mirror. The aperture may have a diameter of about 0.1 to 20 µm, for example about 1 µm followed by the waveguide.

The waveguides may be made from material which absorb wavelengths which are to be suppressed. The waveguide may be used to suppress light with wavelengths larger than EUV. For example, the waveguide may be made from $Si_3N_4$ which has a high absorption for DUV: −400 dB/cm for a wavelength of 150 nm.

The waveguide may have a length of about 50-500 µm, 100-200 µm, or about 150 µm. There may be one aperture or a plurality of apertures forming a patterned array as previously described. The apertures may be any suitable shape.

The performance of the spectral purity filter with the waveguide may be improved by varying and adapting the diameter of the aperture and the length of the waveguide. A cavity within the waveguide structure may have the same shape as the opening aperture or may be adapted to have a different shape and size depending on the wavelength of radiation which is being filtered out.

To improve the mechanical strength of the spectral purity filters, and without compromising the EUV transmission, at least one patterned layer and at least one unpatterned layer may be used in combination. The unpatterned layer may be in the form of a continuous sheet with no apertures therethrough. The patterned layer may include a plurality of apertures. The plurality of apertures may be in the form of a regular or irregular pattern. Tthe diameter of the apertures may be about 0.1-10 µm, for example about 1 µm in diameter. The thickness of the unpatterned layer may be about 10-500 µm, for example about 50 nm. The thickness of the patterned may be about 10-500 µm, for example about 100 µm.

The patterned layer may act as a support for the unpatterned layer and the unpatterned may act as a substrate/support for the patterned layer. The patterned layer and unpatterned layer may be formed from a single piece of material. Alternatively, the patterned and unpatterned layer may be formed separately and thereafter adhered to one another.

There may be only a small reduction in the EUV transmission due to the combination of patterned and unpatterned layers. The combination of the patterned and unpatterned layers may have higher IR-suppression than an unpatterned layer. As both the unpatterned and patterned layer act as a spectral purity filter, this results in improved optical performance of the filter.

The spectral purity filters may be used in combination with any other type of mirror or grazing incidence mirror in a lithographic apparatus.

The spectral purity filter may be located at any position between a collector in the lithographic apparatus and a focal point in the radiation beam after the collector. Alternatively, the spectral purity filter may be located at any suitable position in the illumination system or the projection system.

According to a further embodiment of the invention there is provided a lithographic apparatus including an illumination system configured to condition a radiation beam; a support configured to support a patterning device, the patterning device configured to impart the radiation beam with a pattern in its cross-section to form a patterned radiation beam; a substrate table configured to hold a substrate; a projection system configured to project the patterned radiation beam onto a target portion of the substrate; and a lithographic spectral purity filter comprising an aperture, the aperture having a diameter, wherein the spectral purity filter is configured to enhance the spectral purity of the radiation beam by reflecting radiation of a first wavelength and allowing at least a portion of radiation of a second wavelength to transmit through the aperture, the first wavelength being larger than the second wavelength.

The spectral purity filter may be configured to reflect light with wavelengths larger than about twice the diameter of the aperture, allowing at least a portion of smaller wavelength radiation to be transmitted through the aperture.

The spectral purity filter may be situated behind a collector in the lithographic apparatus.

At least one grazing incidence filter may also be present in the lithographic apparatus.

According to a further embodiment of the present invention, a lithographic apparatus includes a lithographic spectral purity filter comprising an aperture, the aperture having a diameter, wherein the spectral purity filter is configured to enhance the spectral purity of the radiation beam by reflecting radiation of a first wavelength and allowing at least a portion of radiation of a second wavelength to transmit through the aperture, the first wavelength being larger than the second wavelength.

The spectral purity filter may be configured to reflect light with wavelengths larger than about twice the diameter of the aperture, allowing at least a portion of smaller wavelength radiation to be transmitted through the aperture.

The spectral purity filter may be situated behind a collector in the lithographic apparatus.

At least one grazing incidence filter may also be present in the lithographic apparatus.

According to a further embodiment of the present invention, a device manufacturing includes providing a radiation beam; patterning the radiation beam; projecting a patterned beam of radiation onto a target portion of a substrate; and enhancing the spectral purity of the radiation beam by reflecting radiation of a first wavelength and allowing at least a portion of radiation of a second wavelength to transmit through an aperture, the first wavelength being larger than the second wavelength.

The spectral purity filter may be configured to reflect light with wavelengths larger than about twice the diameter of the aperture, allowing at least a portion of smaller wavelength radiation to be transmitted through the aperture.

According to a further embodiment of the present invention, a device is manufactured according to a method including providing a radiation beam; patterning the radiation beam; projecting a patterned beam of radiation onto a target portion of a substrate; and enhancing the spectral purity of the radiation beam by reflecting radiation of a first wavelength and allowing at least a portion of radiation of a second wavelength to transmit through an aperture, the first wavelength being larger than the second wavelength.

The spectral purity filter may be configured to reflect light with wavelengths larger than about twice the diameter of the aperture, allowing at least a portion of smaller wavelength radiation to be transmitted through the aperture.

The manufactured device may be an integrated circuits, an integrated optical system, a guidance and detection pattern for a magnetic domain memory, a liquid crystal display, or a thin-film magnetic head.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
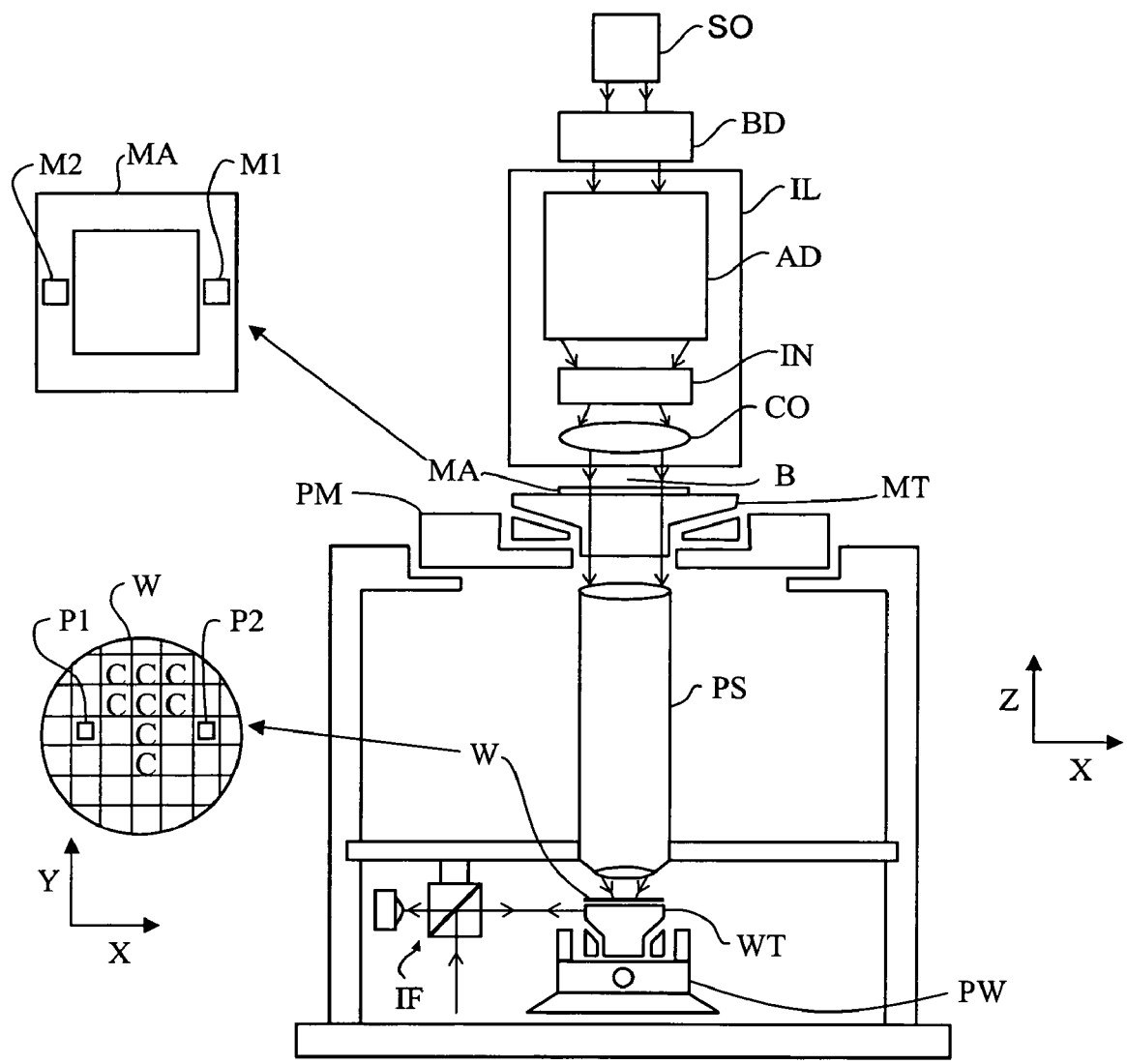
FIG. 1 depicts a lithographic apparatus according to an embodiment of the present invention.

FIG. 1 schematically depicts a lithographic apparatus. The apparatus includes an illumination system (illuminator) IL configured to condition a radiation beam B (e.g. UV radiation or EUV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and a position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1 but which may also be an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
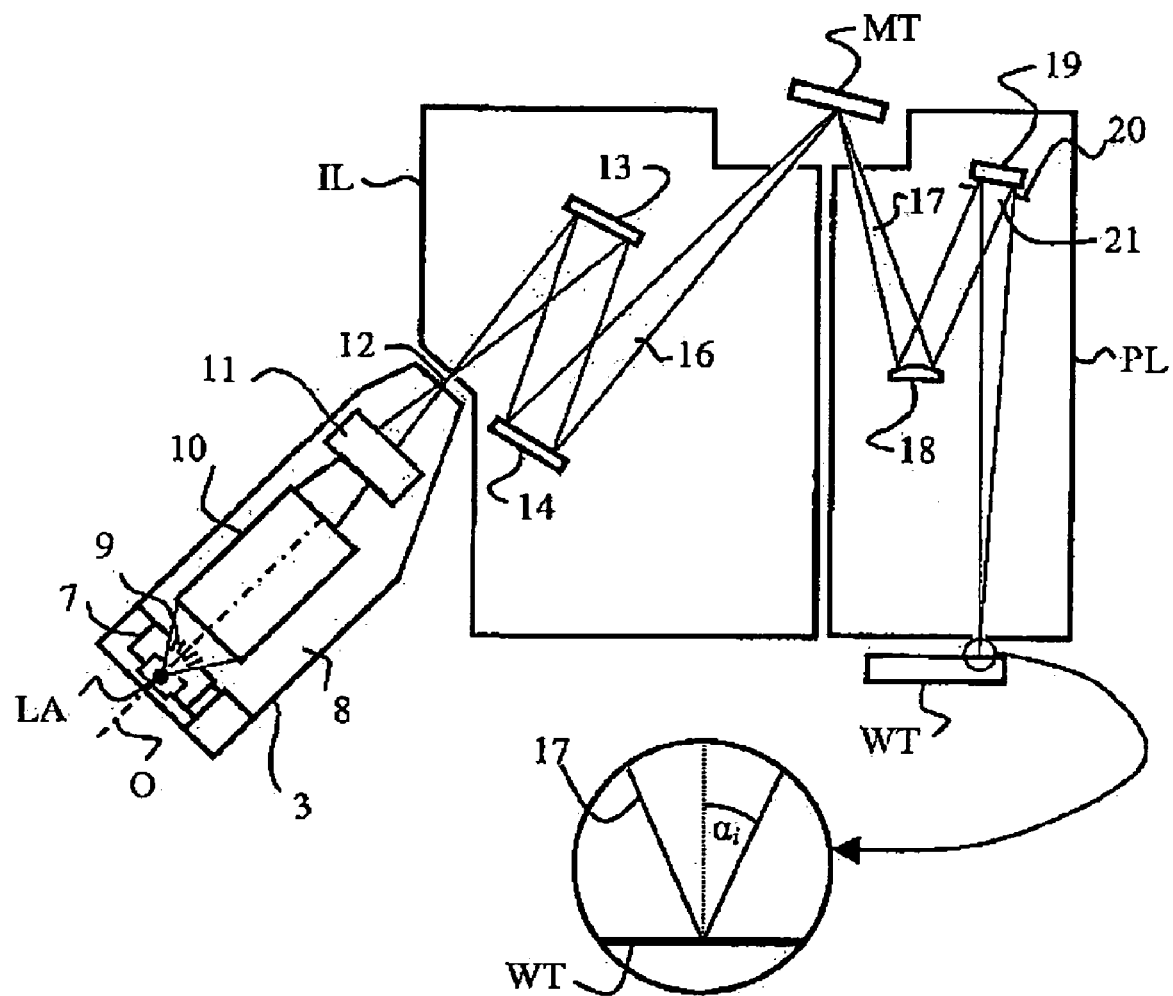
FIG. 2 depicts a lithographic apparatus according to an embodiment of the present invention.

FIG. 2 shows a side view of an EUV lithographic apparatus in accordance with an embodiment of the present invention. It will be noted that, although the arrangement is different to that of the apparatus shown in FIG. 1, the principle of operation is similar. The apparatus includes a source-collector-module or radiation unit 3, an illumination system IL and a projection system PL. Radiation unit 3 is provided with a radiation source LA which may employ a gas or vapor, such as for example Xe gas or Li vapor in which a very hot discharge plasma is created so as to emit radiation in the EUV range of the electromagnetic radiation spectrum. The discharge plasma is created by causing a partially ionized plasma of an electrical discharge to collapse onto the optical axis O. Partial pressures of 0.1 m bar of Xe, Li vapor or any other suitable gas or vapor may be required for efficient generation of the radiation. The radiation emitted by radiation source LA is passed from the source chamber 7 into collector chamber 8 via a gas barrier or "foil trap" 9. The gas barrier includes a channel structure such as, for instance, described in detail in U.S. Pat. Nos. 6,614,505 and 6,359,969, which are incorporated herein by reference. The collector chamber 8 includes a radiation collector 10 which is formed, for example, by a grazing incidence collector. Radiation passed by collector 10 transmits through a spectral purity filter 11 according to the present invention. It should be noted that in contrast to blazed spectral purity filters, the spectral purity filter 11 does not change the direction of the radiation beam. In an alternative embodiment, not shown, the spectral purity filter 11 may reflect the radiation beam as the spectral purity filter 11 may be implemented in the form of a grazing incidence mirror or on the collector 10. The radiation is focused in a virtual source point 12 (i.e. an intermediate focus) from an aperture in the collection chamber 8. From chamber 8, the radiation beam 16 is reflected in illumination system IL via normal incidence reflectors 13,14 onto a reticle or mask positioned on reticle or mask table MT. A patterned beam 17 is formed which is imaged by projection system PL via reflective elements 18,19 onto wafer stage or substrate table WT. More elements than shown may generally be present in the illumination system IL and projection system PL.

One of the reflective elements 19 has in front of it an NA disc 20 having an aperture 21 therethrough. The size of the aperture 21 determines the angle $\alpha_i$ subtended by the patterned radiation beam 17 as it strikes the substrate table WT.

FIG. 2 shows the spectral purity filter 11 according to present invention positioned downstream of the collector 10 and upstream of the virtual source point 12. In alternative embodiments, not shown, the spectral purity filters 11 may be positioned at the virtual source point 12 or at any point between the collector 10 and the virtual source point 12.

Figure 3:
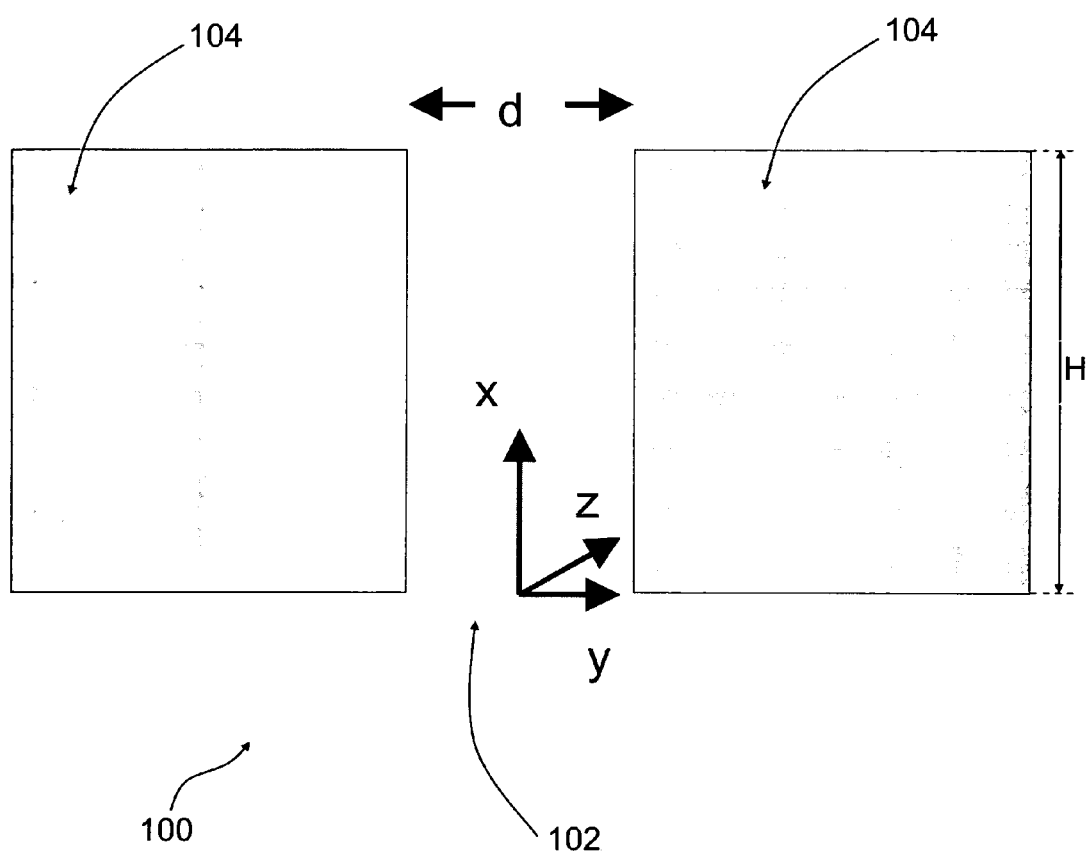
FIG. 3 depicts a three-layer stack of a thin vacuum layer sandwiched between two cladding layers according to an embodiment of the present invention.

FIG. 3 shows a spectral purity filter 100 according to the present invention. The spectral purity filter 100 has a sub-wavelength aperture 102 defined between outer walls 104. The aperture 102 can be a slit or a pinhole (i.e. a substantially circular opening). The aperture has a diameter d and a height H. The height H does not affect the operating principle of the spectral purity filter 100.

The aperture 102 reflects substantially all radiation with wavelengths for which the aperture diameter is below the diffraction limit, the diffraction limit being half the wavelength in the medium that fills the aperture 102. The medium may be a vacuum. For aperture diameters above the diffraction limit, a substantial fraction of the radiation is transmitted through the aperture.

As an example, for a slit with a 100 nm diameter, substantially all light with wavelengths larger than 200 nm is reflected.

For EUV (13.5 nm) a diameter d of about 100 nm is still about 7 wavelengths. Using a numerical analysis, the transmission for EUV of a slit made of 10 µm thick material, is estimated to be about 90%. This transmission value refers to the fraction of the radiation that enters the "open" area of the aperture. Depending on the ratio between the aperture and the surrounding material, the transmission should be corrected. As an example, for a slit with an open to closed ratio of 1:1, the transmission is 50%×90%=45%.

A suppression of light is therefore obtained by using an aperture size such as a sub-wavelength diameter slit which blocks substantially all the light with a wavelength larger than twice the diameter without the need of a waveguide structure for additional suppression.

Figure 4:
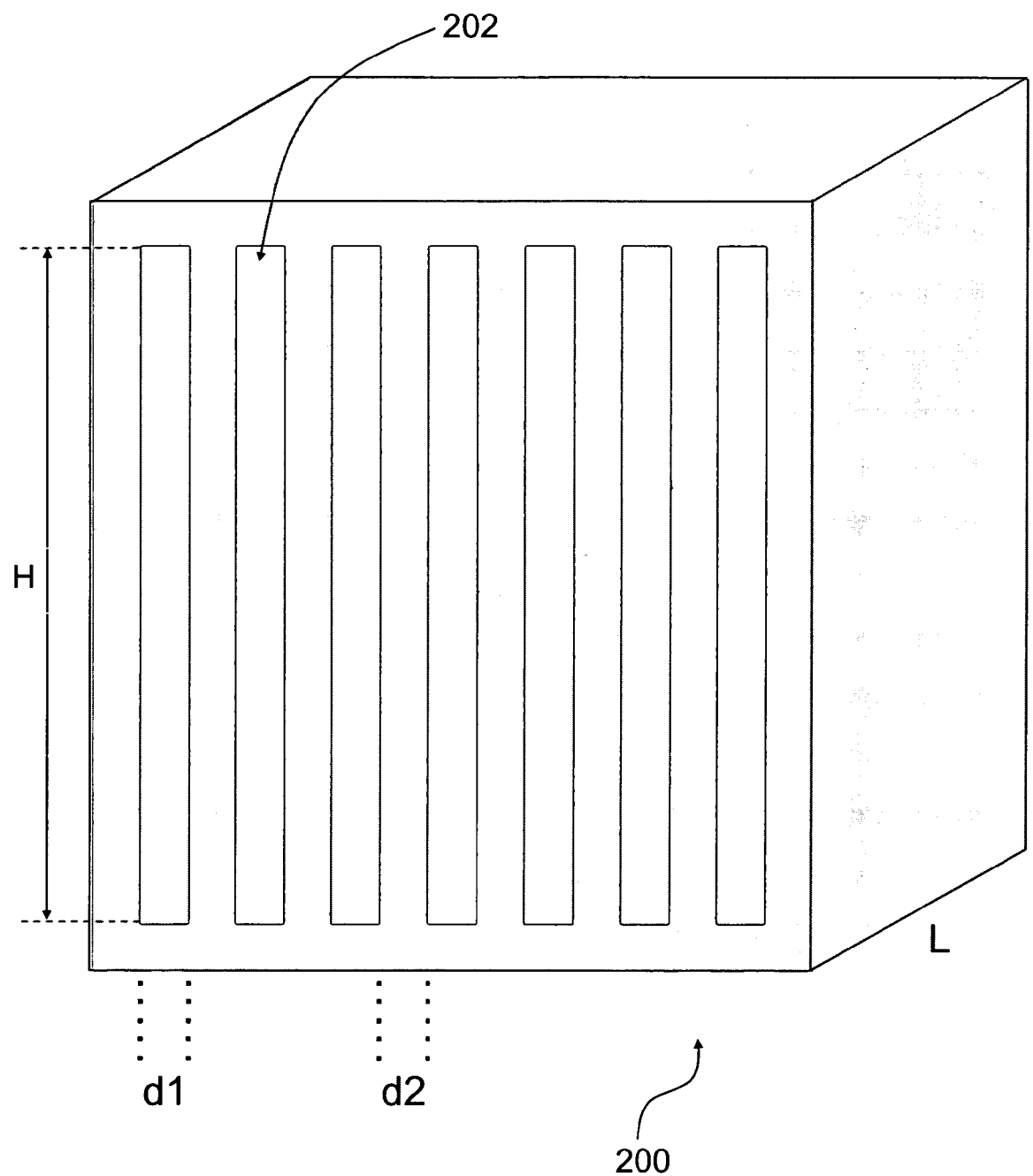
FIG. 4 depicts a spectral purity filter consisting of a plurality of slits according to an embodiment of the present invention.

FIG. 4 relates to a particular embodiment of the present invention which shows a spectral purity filter 200 including a plurality of elongate slits 202. In FIG. 4, the slits 202 have a diameter d1 with a spacing d2 between the slits 202. The slits 202 have a depth L and a height H.

Although FIG. 4 shows a periodic array (i.e. constant values for d1 and d2), any suitable array forming a regular or irregular pattern may be used in order to reduce propagation losses for EUV.

In certain circumstances, it is advisable to vary the spacing between the slits in order to avoid unwanted diffraction effects due to the periodicity of constant spacing between the slits.

Using a single slit with a diameter of about 1-2 µm, visible-infrared wavelengths may be suppressed by a few orders of magnitude while still having an EUV transmission of −3 dB (50%). In addition, UV wavelengths can be suppressed as well, but require a smaller slit diameter resulting in higher propagation losses for EUV. For a 1 µm wide slit, a UV suppression better than −10 dB is attainable for −3 dB EUV transmission. If more losses can be tolerated, then UV suppression better than −40 dB is attainable.

The length and depth of the slit is a parameter to consider because the slit acts as a diffracting element increasing the (grazing) angle of incidence and by consequence reducing the reflection at vacuum-material interfaces. The height of the slit H controls the number of reflections for a given grazing angle of incidence and as a consequence the length of the slit L can control the suppression. The length of the slit L depends on the desired suppression and on the diameter of the slit.

For a filter that suppresses DUV by reflection, the diameter of the pinhole/slit is below the diffraction limit of DUV light and typically 100 nm. For a filter that suppresses DUV by waveguiding (waveguide has strong attenuation for DUV light), the diameter of the pinhole/slit is above the diffraction limit and the suppression can also be controlled by the depth L of the slit. Typically, the diameter is 1-2 µm and depth of the slit is in order of 100 µm.

However, the array of slits as shown in FIG. 4 is more practical than a single slit.

Figure 5:
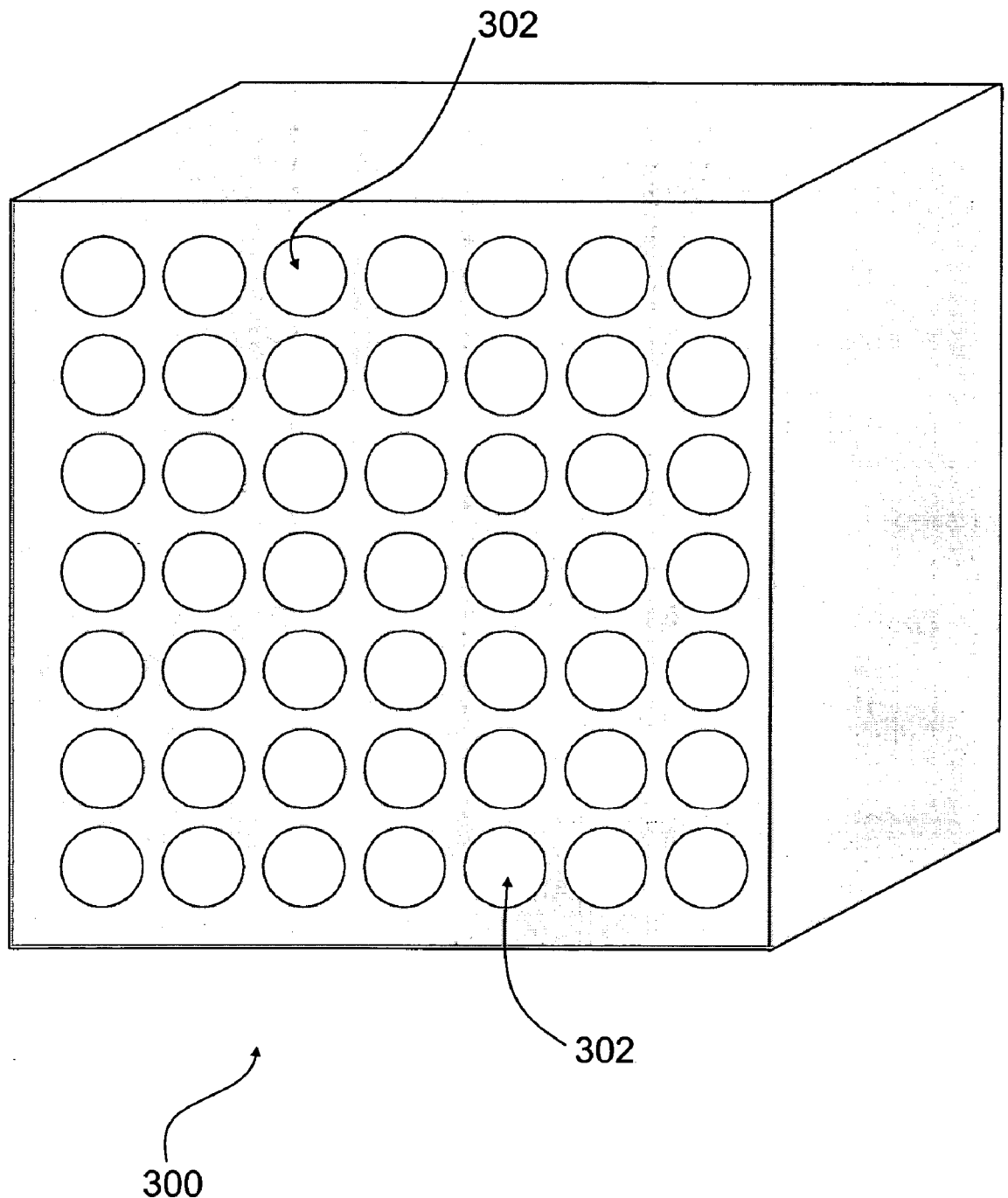
FIG. 5 depicts a spectral purity filter with a plurality of pinholes according to an embodiment of the present invention.

In contrast to the array of elongate slits in the spectral purity filter 200 of FIG. 4, FIG. 5 shows to a spectral purity filter 300 including a large number of pinholes 302. Although the pinholes 302 are shown in a geometric regular pattern in FIG. 5, it should be appreciated that the pinholes may be in an irregular pattern. The diameter of the pinholes 302 may be about 100 nm. The spacing between the pinholes 302 may be about the diameter of the pinholes 302. It should be noted that as in practice an image in the intermediate focus of a lithographic apparatus has a diameter in the order of 10 mm, an array of pinholes is preferably used in order to reduce the propagation losses for EUV.

Referring to heat load and manufacturability, as the spectral purity filters according to the present invention reflect most of the radiation, the impact of head load on the temperature of the filter is low.

The slits and pinholes in the spectral purity filters as shown in FIGS. 3, 4 and 5 are manufactured using lithographic and/or micro-machining techniques. For example, a micro-machining technique involves defining slits in a layer on top of a silicon wafer by photolithography followed by etching deep into the silicon wafer. In order to open the slits, a window is etched into the backside of the wafer, for example by using KOH etching techniques.

Figure 6:
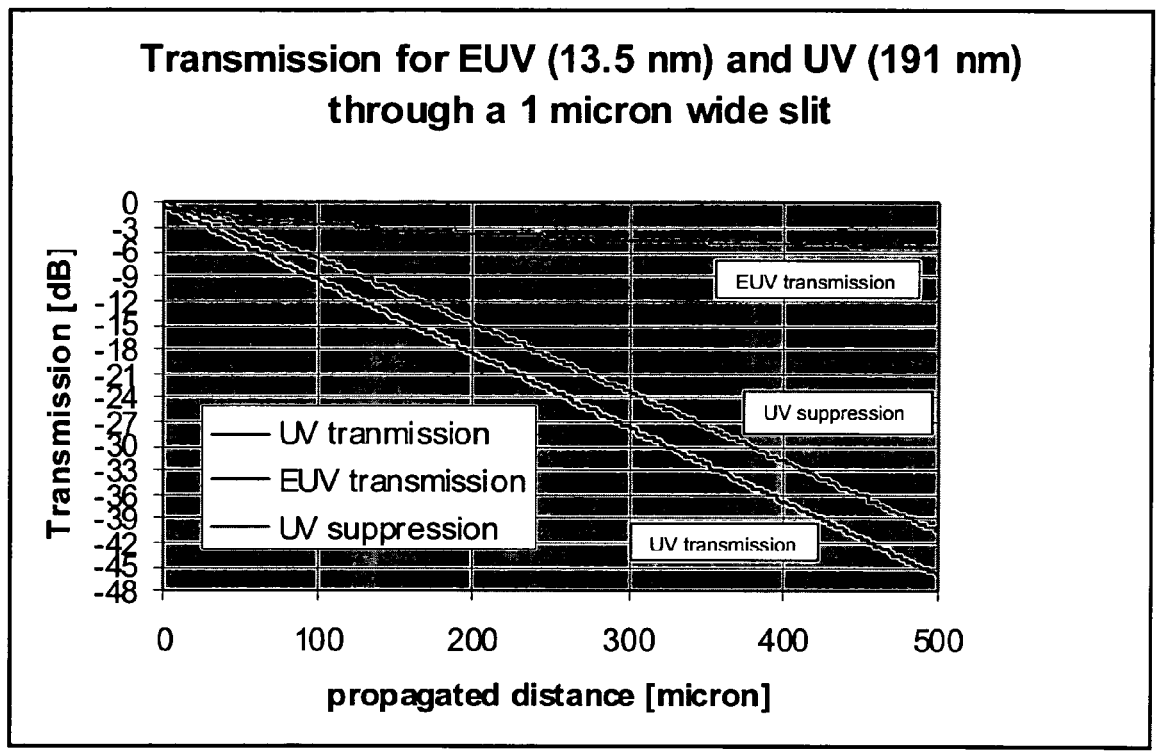
FIG. 6 depicts a calculated transmission for UV, EUV and resulting suppression of UV for a 1 µm wide slit according to an embodiment of the present invention.

FIG. 6 is a calculated transmission curve for UV and EUV and a resulting suppression of UV for a 1 µm wide single slit. From FIG. 6, it can be concluded that:

1. EUV transmission of −3 dB (50%) occurs after a propagation length of 150 microns;
2. UV suppression better than −10 dB is obtained after a propagation length of 150 microns; and
3. If more losses can be tolerated for EUV, a UV suppression better than −40 dB for a EUV transmission of −5.4 dB (29%) may be obtained.

FIG. 6 shows that as the propagation length increases beyond 150 µm, the amount of EUV transmission is detrimentally affected. The propagation length is determined by the depth of the apertures forming the waveguide. Using a waveguide allows a larger diameter aperture to be used in comparison to the spectral purity filters with no waveguide.

A further parameter to be considered is the aspect ratio between transparent and non-transparent regions shown in FIGS. 4 and 5. As the overall transparency of a spectral purity filter including of an array of slits/pinholes is determined by the aspect ratio between the transparent and non-transparent area of the spectral purity filter, the aspect ratio must be considered when designing the spectral purity filters.

Using an array of slits (as shown in FIG. 4) and a plurality of pinholes (as shown in FIG. 5) presents several considerations. For example, using a spectral purity filter including a large number of pinholes compared to a spectral purity filter including a large number of slits is less desirable because:

1. The spectral purity filter with pinholes is less transparent for EUV than a spectral purity filter with slits because the transparent area (i.e. the total area covered by the holes or slits) for the spectral purity filter with pinholes is smaller than for the spectral purity filter with slits for a given diameter of pinholes/slits; and
2. The spectral purity filter with pinholes (i.e. a two-dimension array) is more complex than the spectral purity with slits (i.e. a one-dimensional array) and therefore more difficult to manufacture.

Using a spectral purity filter including a large number pinholes is more desirable because:

1. The structure is less open for debris; and
2. A spectral purity filter with a large number of pinholes will have a larger flow resistance than a structure with a large number of slits. This allows the spectral purity filter to be used for differential pumping as the spectral purity filter induces a flow resistance.

Figure 7:
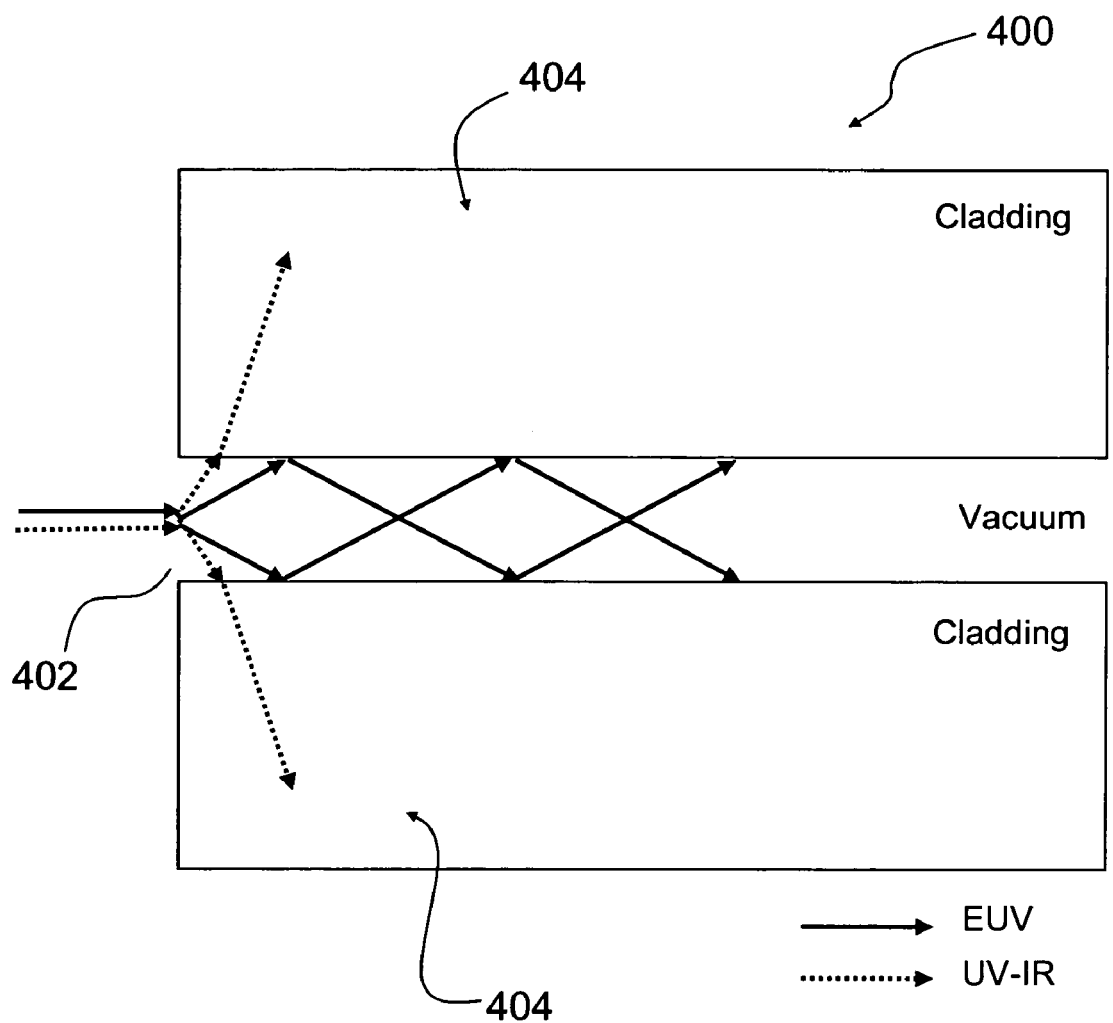
FIG. 7 depicts a three-layer stack including an aperture and a waveguide between two cladding layers according to an embodiment of the present invention.

An alternative to the spectral purity filters shown in FIGS. 4 and 5, is to use a spectral purity filter as shown in FIG. 7. The spectral purity filter 400 in FIG. 7 includes a small aperture 402 connected to a EUV waveguide which is formed by cladding 404 on both sides of a vacuum. The small aperture 402 can be any suitable form of opening such as either a slit or a pinhole. As shown in FIG. 7, the waveguide behind the aperture 402 is of the same diameter as the aperture 402 itself. Although it is possible to use a waveguide with a smaller/larger diameter than the aperture 402, this results in a larger/smaller suppression of the unwanted wavelengths and also results in a smaller/larger transmission of EUV.

The spectral purity filter 400 shown in FIG. 7 therefore is a 3-layer stack of a thin vacuum layer sandwiched between two cladding layers 404 forming a waveguide.

For proper operation of the spectral purity filter 400, the material of the waveguides should be absorbing for the wavelengths that one wants to suppress with the spectral purity filter. There are no specific requirements for the EUV transmission of the material.

As an example: For a filter that is used to suppress DUV wavelengths, $Si_3N_4$ is a good candidate, because it has a high absorption for DUV: −400 dB/cm for a wavelength of 150 nm.

For a single slit pinhole, thickness can in principle be infinite. For an array of slits/pinholes, the thickness should preferably be larger than decay length of light in the absorbing cladding material in order to avoid optical coupling between the light in adjacent pinholes/slits, which is for a sufficiently absorbing material in the order of a few 100 nm.

FIG. 7 represents the operating principle of the spectral purity filter 400 wherein the EUV radiation travels along the waveguide and UV and IR radiation transmits through the cladding 404 of the waveguide. The wavelength selectivity of the spectral purity filter 400 is due to wavelength selective diffraction at the input aperture in combination with reduced reflection at the vacuum-interfaces for larger grazing angles of incidence. From diffraction theory, it is known that the divergence angle due to diffraction at a narrow aperture (e.g. pinhole/slit) is proportional with the ratio wavelength/diameter. Therefore, larger wavelengths have larger grazing angles at the vacuum-cladding interface than smaller wavelengths. In situations such as for grazing angles smaller than the Brewster angle, the Fresnel reflection at an interface decreases with increasing the grazing angle and also the number of reflections per unit propagation length in the waveguide increases with increasing grazing angle. It therefore follows that the transmission of the spectral purity filter decreases with increasing wavelength.

The pattern of the spectral purity filter 200,300 shown in FIGS. 4 and 5 may be used in this embodiment with different aperture sizes. It is preferred that the aperture size of the slit or pinhole shown in FIG. 7 has a diameter of about 1 μm followed by a waveguide which is used to suppress light with wavelengths larger than EUV. The performance of the spectral purity filter can be improved by varying the diameter of the slit and length of the waveguide.

Typically, the diameter of the aperture is around 1 μm. As an example, consider a transmission for a 1 μm wide slit having a length and an input beam with a realistic angular spread of ±7°. After 150 μm propagation along the waveguide, the EUV transmission is 50% while the UV suppression relative to EUV is better than −10 dB. Visible infrared wavelengths will be suppressed even more due to their wavelength.

Taking into account that in practice the image in the intermediate focus of a lithographic apparatus has a diameter in the order of 10 mm, it follows that an array, for example an a-periodic ray, of apertures should be used in order to reduce the propagation losses for EUV.

The overall transparency of a spectral purity filter consisting of an array of slits and/or pinholes is determined by the ratio between the transparent and non-transparent area of the filter. As an example, consider a 1 μm wide slit with a length of 150 μm having an EUV transmission of −3 dB (50%) per slit. In this case, 80% of the spectral purity filter area is transparent, resulting in an overall transmission of 40%.

An analysis of heat load on the spectral purity filter shown in FIG. 6 including a waveguide, can be performed which shows that application of the waveguide spectral purity filter in the intermediate focus is infeasible because the temperature is too high at about 2200° C. It is found that application of the spectral purity filter just behind a collector in a lithographic apparatus is more feasible as the temperature is significantly lower at about 260° C. In addition, heating the filter at an elevated temperature, for example 450° C., the temperature differences between illuminated and non-illuminated areas of a filter can be reduced to practical values of about 140° C. for a filter at 450° C. This significantly reduces the impact of thermal expansions and risks of damaging the spectral purity filter.

Concerning the heat load, it can be concluded that a spectral purity filter at elevated temperatures behind a collector is a desirable configuration.

In a further embodiment, there is provided spectral purity filters with improved mechanical strength. When improving the mechanical strength of the spectral purity filters, it is desirable not to compromise the EUV transmission.

It has been found that a thin $Si_3N_4$ slab, with no apertures, can be used as a spectral purity filter. However, acceptable EUV transmission requires a thin thickness of a layer stack, for example about 100 nm which makes the structure fragile for bending in the vertical (i.e. parallel to the optical axis) direction and eventually leads to cracking of the layer. However, the embodiments shown in FIGS. 4 and 5 allow for a thicker spectral purity filter such of about 100 μm patterned layers. To achieve an acceptable transmission, the spacing (e.g. d2 in FIG. 4) should be kept as small as possible. This makes the spectral purity filter fragile for bending in the horizontal (i.e. orthogonal to the optical axis) direction.

Figure 8:
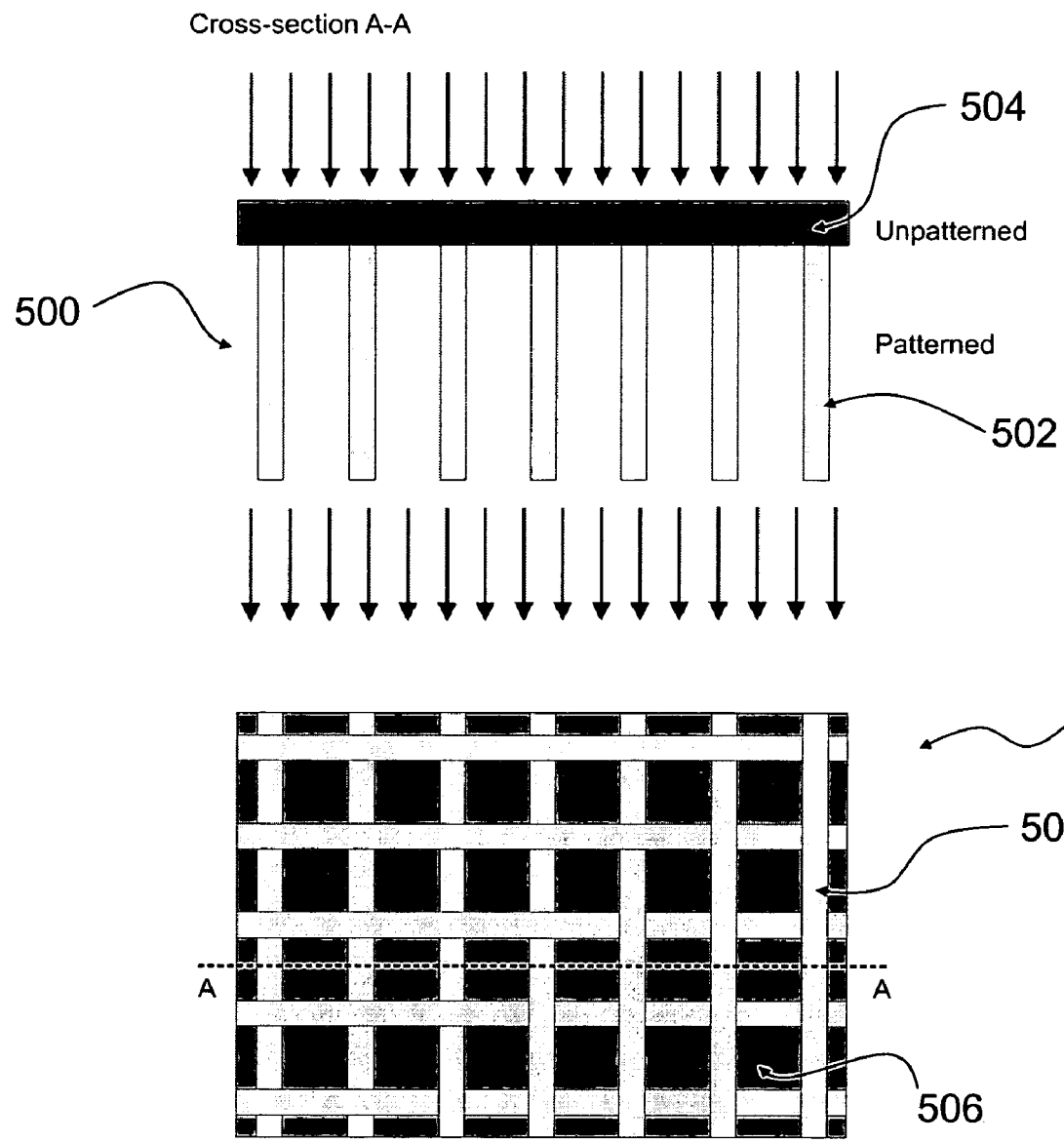
FIG. 8 depicts a combination of patterned and unpatterned stacks in order to increase the mechanical strength of a spectral purity filter according to an embodiment of the present invention.

FIG. 8 shows a combination of a patterned and an unpatterned stack in order to increase the mechanical strength of a spectral purity filter 500. In FIG. 8, the arrows indicate the direction of the EUV light. The bottom part of FIG. 8 is a top plan view of the spectral purity filter 500 and the top part is a cross-section along line A-A.

A combination of patterned layers 502 and unpatterned layers 504 as shown in FIG. 8 increases the mechanical strength of the spectral purity filter 500. The unpatterned layer 504 forms apertures 506 in the spectral purity filter 500. Although FIG. 8 only shows the patterned layer 502 and one unpatterned layer 504, in other embodiments there may be more than one layer of patterned and unpatterned layers.

It should be noted that by using a patterned layer 502 and an unpatterned layer 504, the apertures 506 can be used to suppress longer wavelengths, such as infrared, while the unpatterned layer can be used to suppress UV wavelengths.

In this embodiment, the patterned layer 502 acts as a substrate/support for the unpatterned layer 504. Moreover, the spectral purity filter acts as a cascade of an unpatterned filter and a patterned filter. Therefore, the suppression will be better than the suppression of an unpatterned filter with, for a sufficiently sparsely patterned layer, only a small reduction in the EUV transmission. The suppression by a patterned filter is a geometric effect and improves with increasing wavelength. Therefore, the combination of a patterned and unpatterned layer/stack has the potential of a higher IR-suppression than an unpatterned layer/stack. To suppress infrared wavelengths, the apertures 506 can have a diameter of about 1 μ. The thickness of the unpatterned layer 504 may be about 50-100 nm and the thickness of the patterned layer may vary between about 1-100 μm, depending on whether or not a waveguide-effect is used.

Using an unpatterned layer and a patterned layer therefore improves the mechanical strength compared with spectral purity filters which are only unpatterned (e.g. a thin slab) or patterned (e.g. spectral purity filters as shown in FIGS. 4 and 5).

Due to the improved strength of the spectral purity filter shown in FIG. 8, the thickness of the unpatterned layer/stack may be reduced, which results in an improved EUV transmission. The thickness may be reduced to about 50-100 nm. As an example, using a $Si_3N_4$ stack and reducing the thickness of the unpatterned $Si_3N_4$ stack to 50 nm results in an EUV transmission of 65% and DUV transmission (wavelength of 157 nm) of still 1.6%. The EUV losses due to the patterned stack are minimised by proper design of the patterned stack by using a relatively sparse mesh. As both the unpatterned and patterned stack act as a spectral purity filter, this results in an improved optical performance of the spectral purity filter.

As previously described, the filter can be manufactured by known lithographic and/or micro-machining techniques. As an example, a Si-wafer with on top a $Si_3N_4$ layer may be used. By etching from the backside of the Si-wafer up to $Si_3N_4$ layer, the patterned layer can be defined. The patterned and unpatterned layers may be formed form the same piece of material or alternatively formed separately and thereafter attached to one another.

The spectral purity filters as described above may be used in any suitable type of lithographic apparatus. Moreover, the spectral purity filters according to the present invention may be used in combination with at least one grazing incidence mirror in a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the term "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The descriptions above are intended to be illustrative, not limiting. Thus, it should be appreciated that modifications may be made to the present invention as described without departing from the scope of the claims set out below.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm), X-ray and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it should be appreciated that the present invention may be practiced otherwise than as described. For example, the present invention may take the form of a computer program containing one or more sequences of machine-readable instructions that are executable to cause an apparatus to perform a method as disclosed above, or a data storage medium (e.g. semiconductor memory, magnetic or optical disk) having such a computer program stored therein.

What is claimed is:

1. A lithographic spectral purity filter comprising an aperture, the spectral purity filter being configured to enhance the spectral purity of a radiation beam by reflecting radiation of a first wavelength and allowing at least a portion of radiation of a second wavelength but substantially not of the first wavelength to transmit through the aperture, the first wavelength being larger than the second wavelength.

2. A lithographic spectral purity filter according to claim 1, wherein the spectral purity filter is configured to reflect radiation with wavelengths larger than about twice the diameter of the aperture, allowing at least a portion of smaller wavelength radiation to be transmitted through the aperture.

3. A lithographic spectral purity filter according to claim 1, wherein there is only a single aperture.

4. A lithographic spectral purity filter according to claim 1, further comprising at least one additional aperture so that there are at least two or more apertures.

5. A lithographic spectral purity filter according to claim 1, wherein there is a plurality of apertures forming a patterned array.

6. A lithographic spectral purity filter according to claim 1, wherein the aperture is an elongated slit.

7. A lithographic spectral purity filter according to claim 1, wherein the aperture is substantially circular.

8. A lithographic spectral purity filter according to claim 1, wherein the aperture has a diameter of about 1-2 μm.

9. A lithographic spectral purity filter according to claim 1, wherein the spectral purity filter has a thickness of about 10 μm.

10. A lithographic spectral purity filter according to claim 5, wherein the diameter of the apertures is about 100 nm.

11. A lithographic spectral purity filter according to claim 5, wherein the spectral purity filter has a thickness of about 10 μm.

12. A lithographic spectral purity filter according to claim 1, wherein an aspect ratio formed between an area formed by the at least one aperture and a remaining surface area of the spectral purity filter is greater than about 30%.

13. A lithographic spectral purity filter according to claim 1, wherein the spectral purity filter has a transmission of about 80% for EUV radiation.

14. A lithographic spectral purity filter according to claim 1, wherein the spectral purity filter is configured to filter any combination of DUV, UV visible and IR radiation.

15. A lithographic spectral purity filter according to claim 1, further comprising an EUV waveguide.

16. A lithographic spectral purity filter according to claim 15, wherein the waveguide has transmission of about 90% for EUV radiation.

17. A lithographic spectral purity filter according to claim 15, wherein the aperture has a diameter of about 1 μm.

18. A lithographic spectral purity filter according to claim 15, wherein the waveguide is made of a material capable of absorbing radiation in a wavelength range to be suppressed.

19. A lithographic spectral purity filter according to claim 18, wherein the material is $Si_3N_4$.

20. A lithographic spectral purity filter according to claim 15, wherein the waveguide has a length of about 100 μm.

21. A lithographic spectral purity filter according to claim 1, wherein there is a combination of at least one patterned and at least one unpatterned layer, the patterned layer comprising the aperture.

22. A lithographic spectral purity filter according to claim 21, wherein the patterned layer comprises a plurality of apertures.

23. A lithographic spectral purity filter according to claim 21, wherein the aperture has a diameter of about 1 μm.

24. A lithographic spectral purity filter according to claim 1 in combination with at least one grazing incidence mirror.

25. A lithographic spectral purity filter according to claim 1, wherein the spectral purity filter is configured to filter EUV radiation with a wavelength of about 5-20 nm.

26. A lithographic spectral purity filter according to claim 1, wherein the spectral purity filter is configured to filter EUV radiation with a wavelength of about 13.5 nm.

* * * * *